(12) United States Patent
Nakanishi et al.

(10) Patent No.: US 8,429,494 B2
(45) Date of Patent: Apr. 23, 2013

(54) NONVOLATILE RANDOM ACCESS MEMORY AND NONVOLATILE MEMORY SYSTEM

(75) Inventors: Kenichi Nakanishi, Tokyo (JP); Keiichi Tsutsui, Tokyo (JP); Junichi Koshiyama, Tokyo (JP)

(73) Assignee: Sony Corporation, Tokyo (JP)

( * ) Notice: Subject to any disclaimer, the term of this patent is extended or adjusted under 35 U.S.C. 154(b) by 400 days.

(21) Appl. No.: 12/816,685

(22) Filed: Jun. 16, 2010

(65) Prior Publication Data

US 2011/0035646 A1 Feb. 10, 2011

(30) Foreign Application Priority Data

Aug. 6, 2009 (JP) ................. 2009-183517

(51) Int. Cl.
*G11C 29/00* (2006.01)
*H03M 13/05* (2006.01)
*G06F 11/10* (2006.01)

(52) U.S. Cl.
USPC .......................................... 714/763

(58) Field of Classification Search ............ 714/763
See application file for complete search history.

(56) References Cited

U.S. PATENT DOCUMENTS

| | | | |
|---|---|---|---|
| 5,793,774 A | 8/1998 | Usui et al. | |
| 6,505,319 B1 * | 1/2003 | Kodama | 714/752 |
| 6,868,007 B2 * | 3/2005 | Hasegawa et al. | 365/185.09 |
| 7,290,082 B2 * | 10/2007 | Kwon | 711/103 |
| 7,664,987 B2 * | 2/2010 | Bychkov et al. | 714/30 |
| 7,810,017 B2 * | 10/2010 | Radke | 714/769 |
| 7,900,118 B2 * | 3/2011 | Chang et al. | 714/763 |
| 7,984,325 B2 * | 7/2011 | Fukutomi et al. | 714/6.12 |
| 8,151,036 B2 * | 4/2012 | Yasufuku | 711/103 |
| 2010/0083050 A1 | 4/2010 | Ohyama | |
| 2010/0293418 A1 * | 11/2010 | Nagashima | 714/54 |

FOREIGN PATENT DOCUMENTS

| | | |
|---|---|---|
| JP | 8-137763 | 5/1996 |
| JP | 2001-14888 | 1/2001 |
| JP | 2006-18373 | 1/2006 |
| JP | 2006-127441 | 5/2006 |
| JP | 2006-221334 | 8/2006 |
| JP | 2008-257476 | 10/2008 |

OTHER PUBLICATIONS

U.S. Appl. No. 12/874,914, filed Sep. 2, 2010, Koshiyama et al.

* cited by examiner

*Primary Examiner* — James C Kerveros
(74) *Attorney, Agent, or Firm* — Oblon, Spivak, McClelland, Maier & Neustadt, L.L.P.

(57) ABSTRACT

A nonvolatile random access memory includes: a nonvolatile storage area that is randomly accessible and includes a data area to store data and an error-correcting-code area to store an error correcting code, the data area including at least one data area to which a data area unit size is assigned, the error-correcting-code area including at least one error-correcting-code area to which an error-correcting-code-area unit size is assigned; and a nonvolatile storage area controller to set a data size used when the at least one data area is accessed, as the data area unit size. The nonvolatile storage area controller manages the data area and the error-correcting-code area based on the set data area unit size and assigns the at least one error-correcting-code area with the error-correcting-code-area unit size to the at least one data area with the data area unit size based on the data area unit size.

19 Claims, 18 Drawing Sheets

※ Case of data bus width of 32 bits (4 bytes) of NVRAM

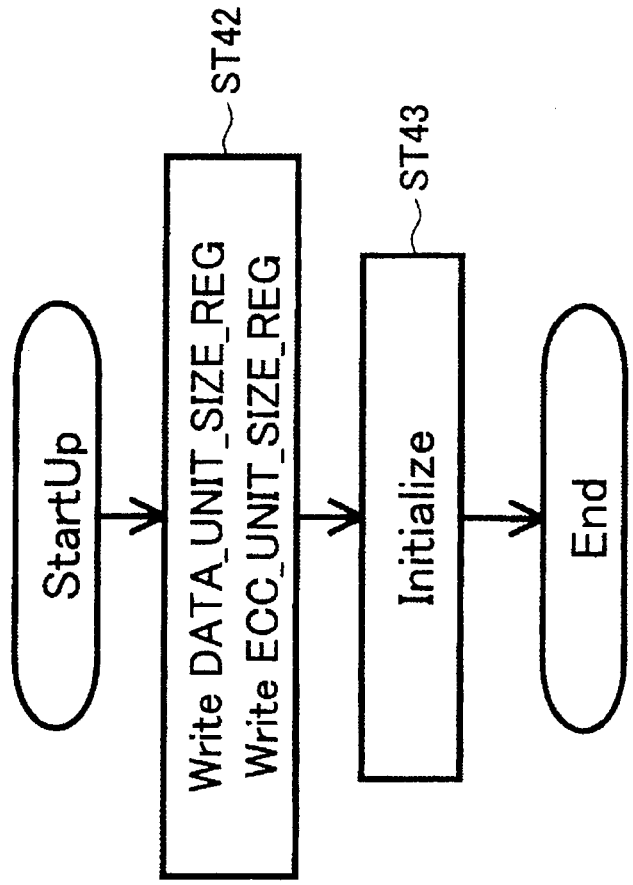
FIG.15B Without setting storage function
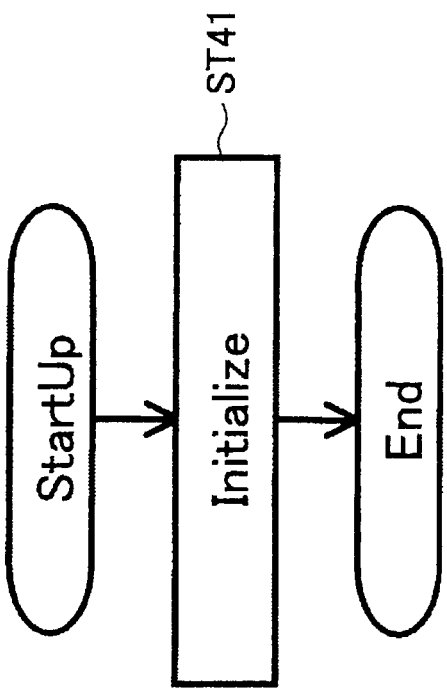
FIG.15A With setting storage function

NONVOLATILE RANDOM ACCESS MEMORY AND NONVOLATILE MEMORY SYSTEM

BACKGROUND OF THE INVENTION

1. Field of the Invention

The present invention relates to a nonvolatile random access memory that is randomly accessible, and a nonvolatile memory system.

2. Description of the Related Art

In recent years, there have been progressed development and commercialization of a ferroelectric random access memory (FeRAM), a programmable conductor random access memory (PCRAM), and a resistance random access memory (ReRAM) as nonvolatile random access memories (NVRAMs) that are capable of saving data after a power is turned off while being randomly accessible as in a case of a static random access memory (SRAM) and a dynamic random access memory (DRAM) as volatile random access memories (RAMs).

Those NVRAMs are expected as substitution of RAMs in the future, and new applications are being searched for owing to the feature of nonvolatility.

Nonvolatile memories (NVMs) typified by a flash have the feature that data retention characteristics are lowered along with an increase in the number of rewrite/deletion of memory cells. Accordingly, by adding an error correcting code (ECC) to data to be written, reliability can be improved.

The same effect is also expected with respect to the NVRAM by adding the ECC.

FIG. 1 is a diagram showing a mapping example of an NAND flash and a storage space.

FIG. 2 is a diagram showing an arrangement example of sector data and a page size of the NAND flash.

FIG. 3 is a diagram showing a processing procedure of the NAND flash at a time of update of a sector.

The NAND flash is accessed in a page PG unit as shown in FIG. 1 and accordingly is suitable for storage use in which access is made in a sector SCT unit (512 bytes).

Errors of data on a page PG can be corrected by adding an ECC as shown in FIGS. 2 and 3, with the result that the number of rewrite of data as a storage can be suppressed.

These days, a page size as a write unit is increased in the NAND flash, which causes deterioration of random access performance in a sector unit as a storage.

This is because, in order to update data of a page, it is necessary to rewrite data of all sectors SCT at least included in the page together with the ECC, as shown in FIG. 3.

In the example of FIG. 3, in a case where only a portion of a sector SCT2 of a page PG1 is rewritten, it is necessary to recalculate the ECC of the page PG1 in which the sector SCT2 is updated to new data, because the page PG1 is a write unit and is simultaneously a unit used for calculating the ECC. In addition, since the NAND flash needs deletion, it is necessary to write the updated data in a block BLKB that is different from a block BLKA, together with a newly calculated ECC.

For that reason, an apparatus that applies the NAND flash such as an SSD and a flash card to realize a storage has needed to absorb a difference among the ECC, the write unit, and the deletion unit and improve the random access performance in the sector unit.

Further, a demand for improvement of an ECC correction ability has been increased in order to suppress the number of rewrite, and a size for storing an ECC code has also been expanded.

SUMMARY OF THE INVENTION

On the other hand, in a case where the number of rewrite is intended to be suppressed by the ECC in a new NVRAM as described above, it is assumed that the NVRAM is accessed as a RAM. Accordingly, dislike the NAND flash, an access unit size that becomes a common reference as typified by a sector of a storage does not exist.

Accordingly, there is a disadvantage that a restriction on a data size that becomes a unit as a specification of a memory side significantly lowers flexibility of access made from an application that uses that NVRAM.

In view of the above circumstances, there is a need for a nonvolatile random access memory and a nonvolatile memory system that are capable of saving data after a power is turned off while being randomly accessible and capable of adding an ECC in accordance with an application.

According to an embodiment of the present invention, there is provided a nonvolatile random access memory including: a nonvolatile storage area that is randomly accessible and includes two areas of a data area to store data and an error-correcting-code area to store an error correcting code, the data area including at least one data area to which a data area unit size is assigned, the error-correcting-code area including at least one error-correcting-code area to which an error-correcting-code-area unit size is assigned; and a nonvolatile storage area controller to set a data size used when the at least one data area is accessed, as the data area unit size from an outside. The nonvolatile storage area controller manages the data area and the error-correcting-code area based on the set data area unit size and assigns the at least one error-correcting-code area with the error-correcting-code-area unit size that is set by the nonvolatile storage area controller to the at least one data area with the data area unit size based on the data area unit size of the at least one data area.

According to another embodiment of the present invention, there is provide a nonvolatile memory system including: a nonvolatile random access memory that is randomly accessible and includes a nonvolatile storage area that is randomly accessible and includes two areas of a data area and an error-correcting-code area to store an error correcting code, the data area including at least one data area to which a data area unit size is assigned, the error-correcting-code area including at least one error-correcting-code area to which an error-correcting-code-area unit size is assigned, and a nonvolatile storage area controller to set a data size used when the at least one data area is accessed, as the data area unit size from an outside; and a memory controller to control access to the nonvolatile random access memory. The nonvolatile storage area controller manages the data area and the error-correcting-code area based on the set data area unit size and assigns the at least one error-correcting-code area with the error-correcting-code-area unit size that is set by the nonvolatile storage area controller to the at least one data area with the data area unit size based on the data area unit size of the at least one data area.

According to the embodiments of the present invention, it is possible to realize a nonvolatile random access memory (NVRAM) capable of saving data after a power is turned off while being randomly accessible as in a case of an SRAM and a DRAM as volatile random access memories (RAMs).

Further, it is possible to provide means for adding an ECC in a way that is easy for an application to randomly access the NVRAM, and improve reliability of data.

These and other objects, features and advantages of the present invention will become more apparent in light of the following detailed description of best mode embodiments thereof, as illustrated in the accompanying drawings.

BRIEF DESCRIPTION OF DRAWINGS

FIG. 15 are flowcharts for explaining processing of setting information in accordance with presence/absence of a setting storage function within the NVRAM;

DESCRIPTION OF PREFERRED EMBODIMENTS

Hereinafter, embodiments of the present invention will be described with reference to the drawings.

It should be noted that descriptions will be given in the following order.
1. First embodiment
2. Second embodiment
(1. First embodiment)

Figure 1:
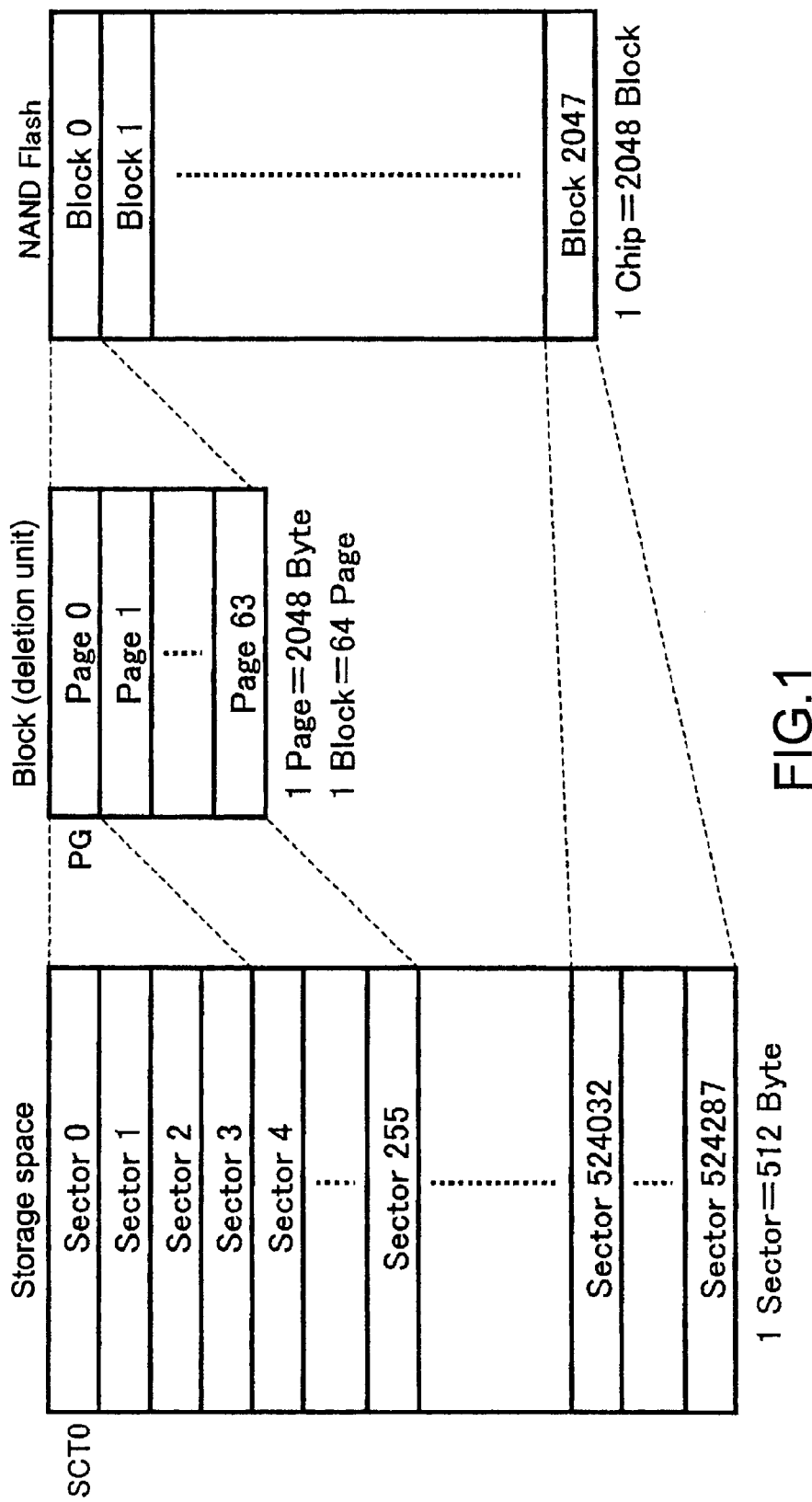
FIG. 1 is a diagram showing a mapping example of an NAND flash and a storage space.
Figure 2:
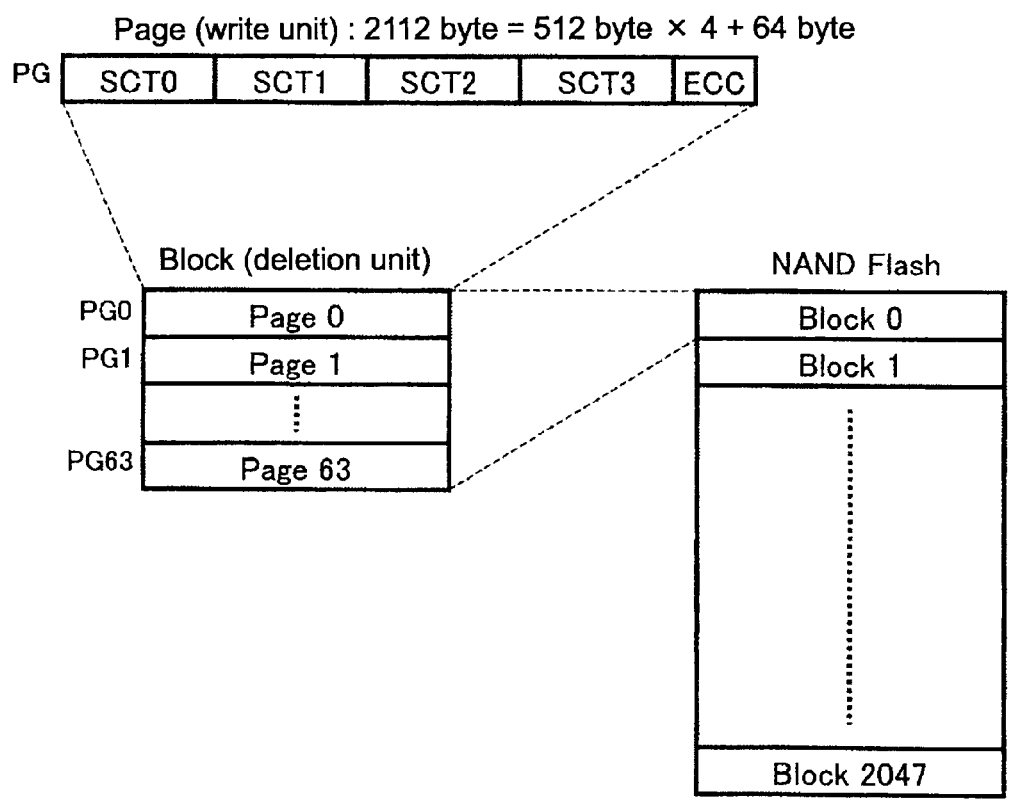
FIG. 2 is a diagram showing an arrangement example of sector data and a page size of the NAND flash.
Figure 3:
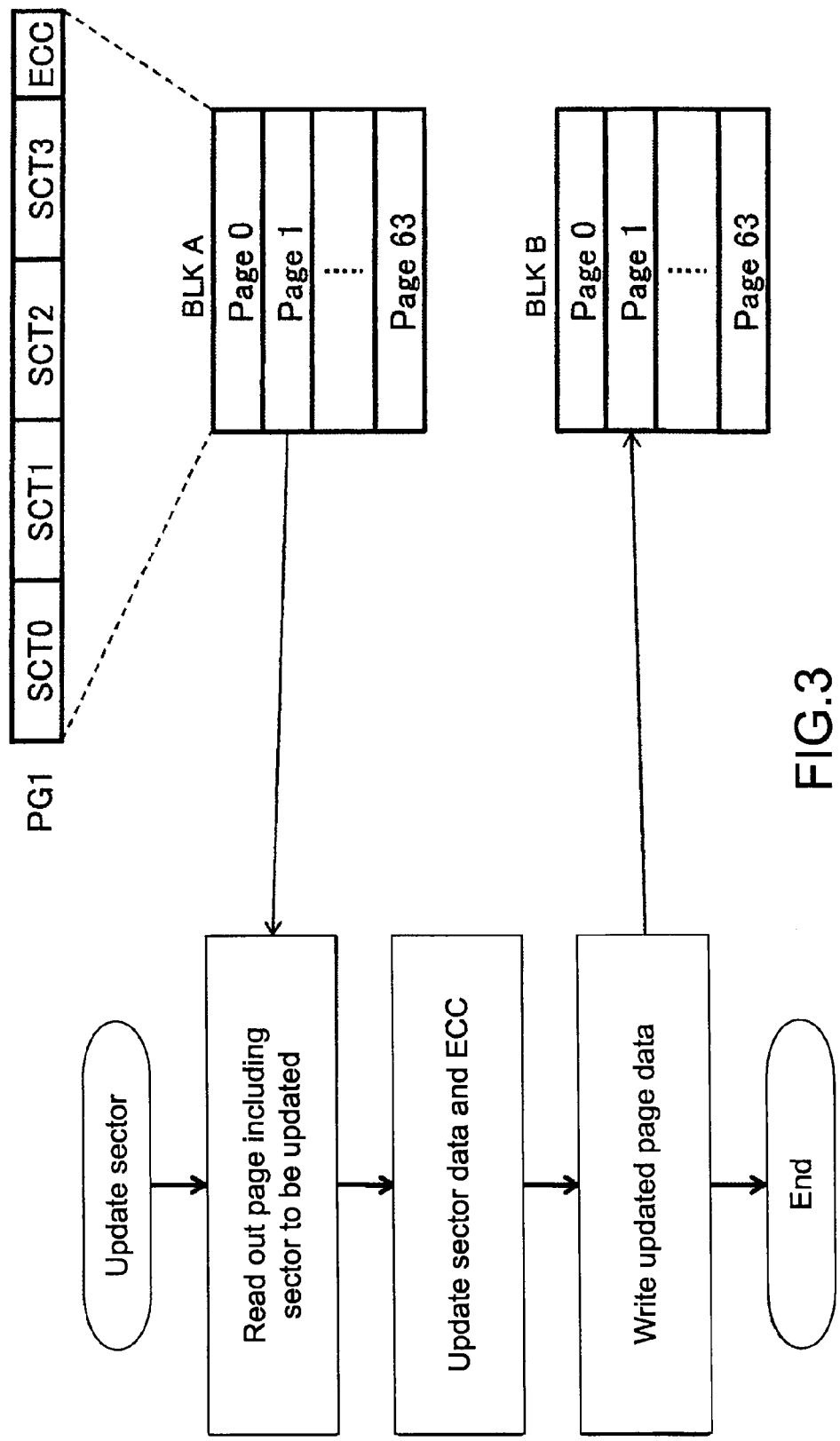
FIG. 3 is a diagram showing a processing procedure of the NAND flash at a time of update of a sector.
Figure 4:
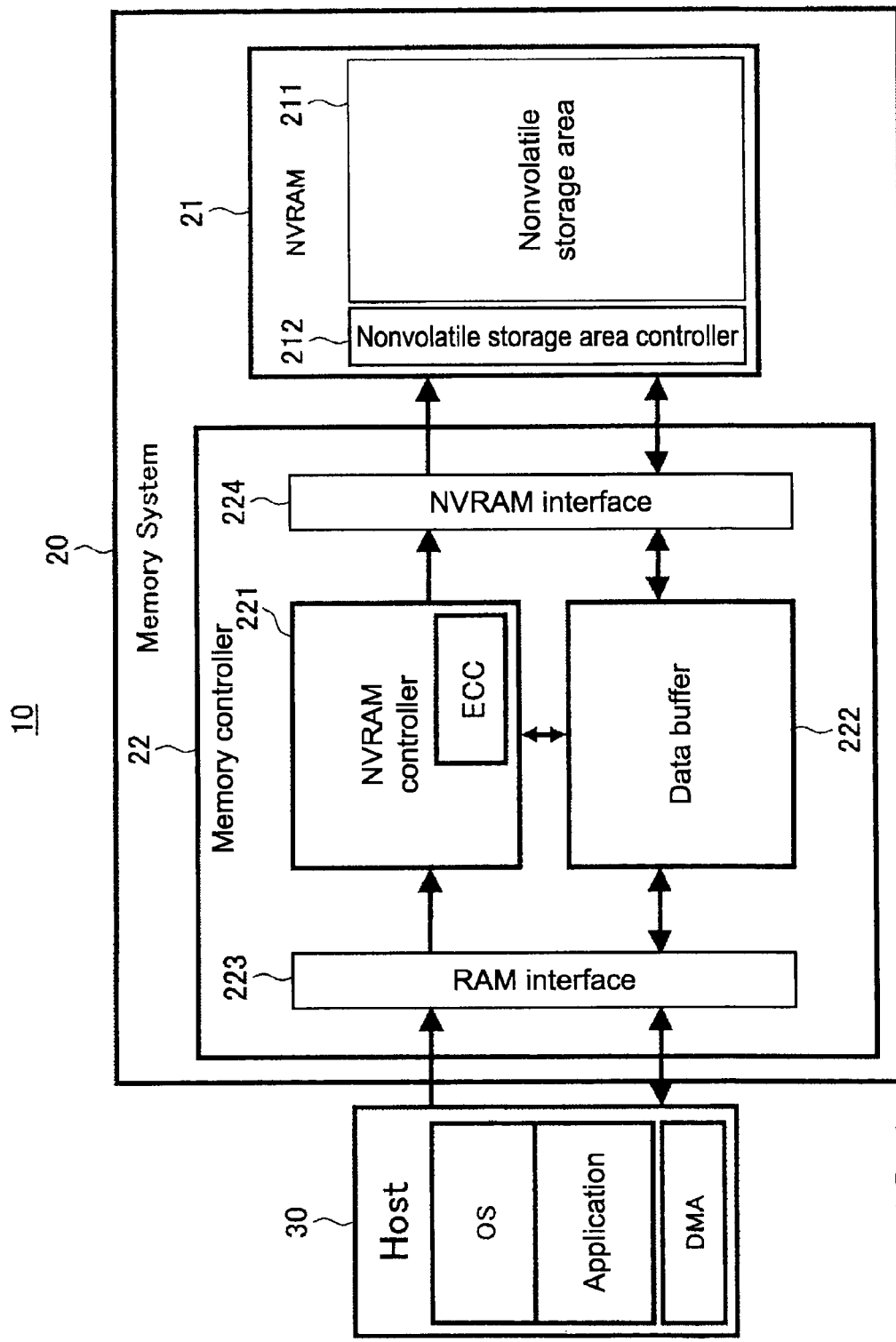
FIG. 4 is a diagram showing a structure of a nonvolatile memory system equipped with a nonvolatile random access memory (NVRAM) according to a first embodiment of the present invention.

FIG. 4 is a diagram showing a structure of a nonvolatile memory system equipped with a nonvolatile random access memory (NVRAM) according to a first embodiment of the present invention.

A memory system 10 according to the first embodiment includes a nonvolatile memory system 20 including an NVRAM and a host apparatus 30 that is capable of accessing the NVRAM of the nonvolatile memory system 20.

The nonvolatile memory system 20 includes an NVRAM 21 and a memory controller 22.

The NVRAM 21 of the first embodiment includes a nonvolatile storage area 211 and a nonvolatile storage area controller 212.

The nonvolatile storage area 211 includes two areas of a data area ARDT and an area for storing an error correcting code (ECC) (ECC area AREC).

Figure 5:
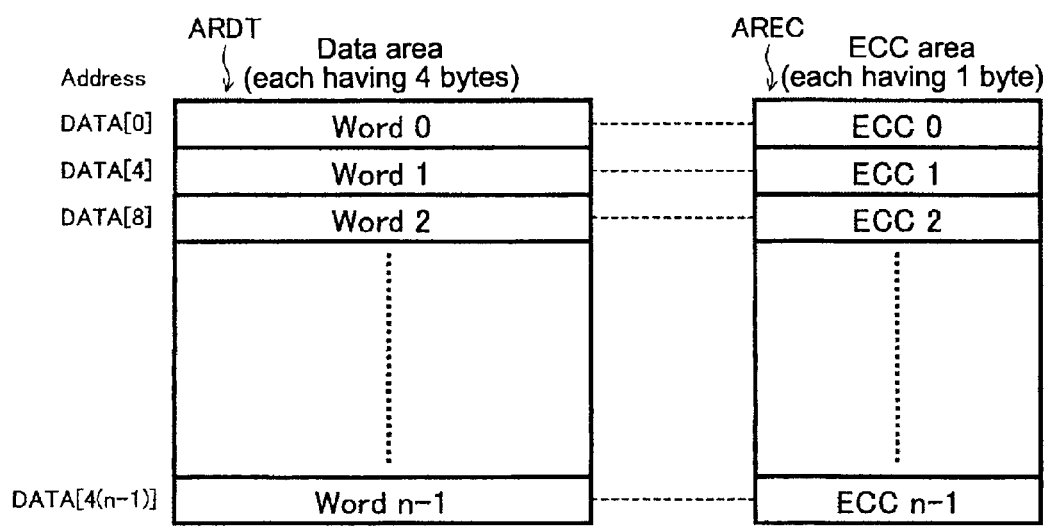
FIG. 5 is a diagram showing a relationship between a data area and an ECC area.

FIG. 5 is a diagram showing a relationship between the data area ARDT and the ECC area AREC.

In an example of FIG. 5, a one-to-one correspondence is established between a data area (sectioned data area) of 4 bytes and an ECC area (sectioned ECC area) of 1 byte.

The data area ARDT is accessible by directly specifying an address from the memory controller 22, with 4 bytes being 1 word. The ECC area AREC does not need to be accessed by directly specifying an address from the memory controller 22 as in the case of the data area ARDT. In this embodiment, the ECC area AREC can be accessed via ECC_CODE_REG of a register area ARRG as shown in FIG. 7.

Figure 7:
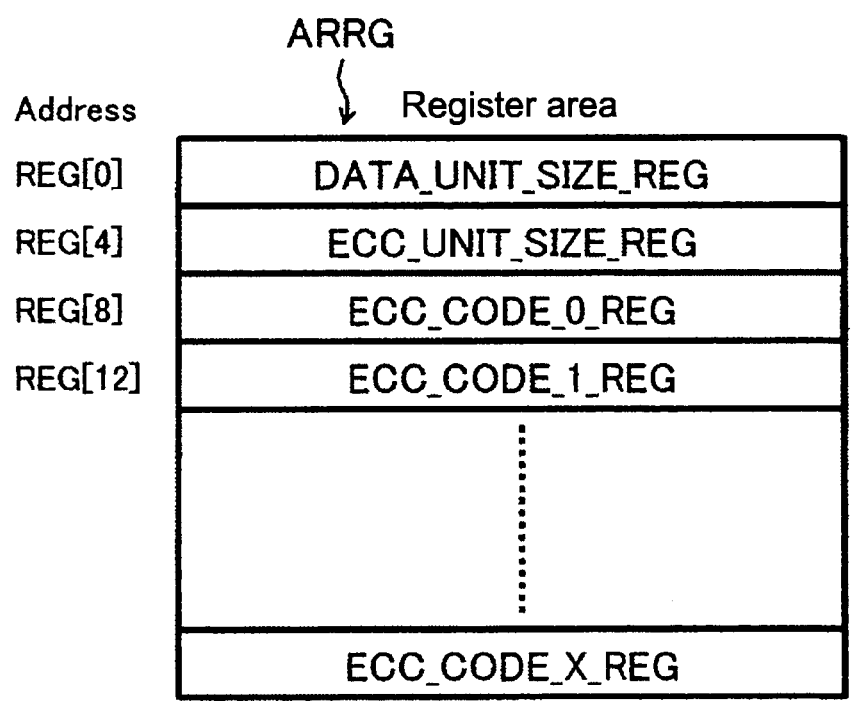
FIG. 7 is a diagram showing an example of a register area according to the first embodiment.

For example, when data is written in an address DATA[4] of a data area (sectioned data area), an ECC code calculated for the data of 4 bytes is set in ECC_CODE_0_REG of FIG. 7 and stored in ECC1 of 1 byte in an ECC area (sectioned ECC area).

Further, when data is read from the address DATA[4] of the data area (sectioned data area), data in the ECC1 of the ECC area (sectioned ECC area) is read out and a value thereof is acquired via the ECC_CODE_0_REG of FIG. 7 by the memory controller 22, with the result that an error detection or correction of the data can be performed.

In the NVRAM 21 according to the first embodiment, the data area ARDT and the ECC area AREC are formed in the single nonvolatile storage area 211.

The nonvolatile storage area controller 212 of the NVRAM 21 has a function of managing the data area ARDT and the ECC area AREC in a unit size that is set for each of the data areas (sectioned data areas) and the ECC areas (sectioned ECC area) and mapping an ECC area unit size of the ECC area (sectioned ECC area) to each access unit of the data area (sectioned data area).

In this embodiment, the nonvolatile storage area controller 212 of the NVRAM 21 has a function of setting a data area unit size constituted of a plurality of bytes, as a unit used when the host apparatus 30 accesses the data area (sectioned data area) via the memory controller 22. This function is referred to as a nonvolatile storage area setting function.

In an example of FIG. 7, the data area unit size is set in DATA_UNIT_SIZE_REG. The nonvolatile storage area controller 212 has a function of managing the data area ARDT and the ECC area AREC based on the set data area unit size and mapping an ECC area unit size of the ECC area (sectioned ECC area) for each access unit of the data area (sectioned data area).

Similarly, in the example of FIG. 7, the ECC area unit size of the ECC area (sectioned ECC area) that is mapped to each access unit of the data area (sectioned data area) can be directly set from the outside by using ECC_UNIT_SIZE_REG. For example, the above state is a state where 4 is set in DATA_UNIT_SIZE_REG and 1 is set in ECC_UNIT_SIZE_REG with respect to the NVRAM of the state shown in FIG. 5.

Actually, a size of the access unit to be used for the data area (sectioned data area) is determined in accordance with an operating system (OS) or an application of the host apparatus 30.

For example, generally, in a case of a program code, access is made in a unit of several bytes that are input in an instruction cash of a CPU (Central Processing Unit) and in a case of a virtual memory or user data, access is made in a unit of 512 bytes or 4,096 bytes.

Further, the size of the access unit may also be restricted in accordance with a hardware (HW) specification of the system such as a transfer size of a DMA (Direct Memory Access) controller, or the like.

Figure 6:
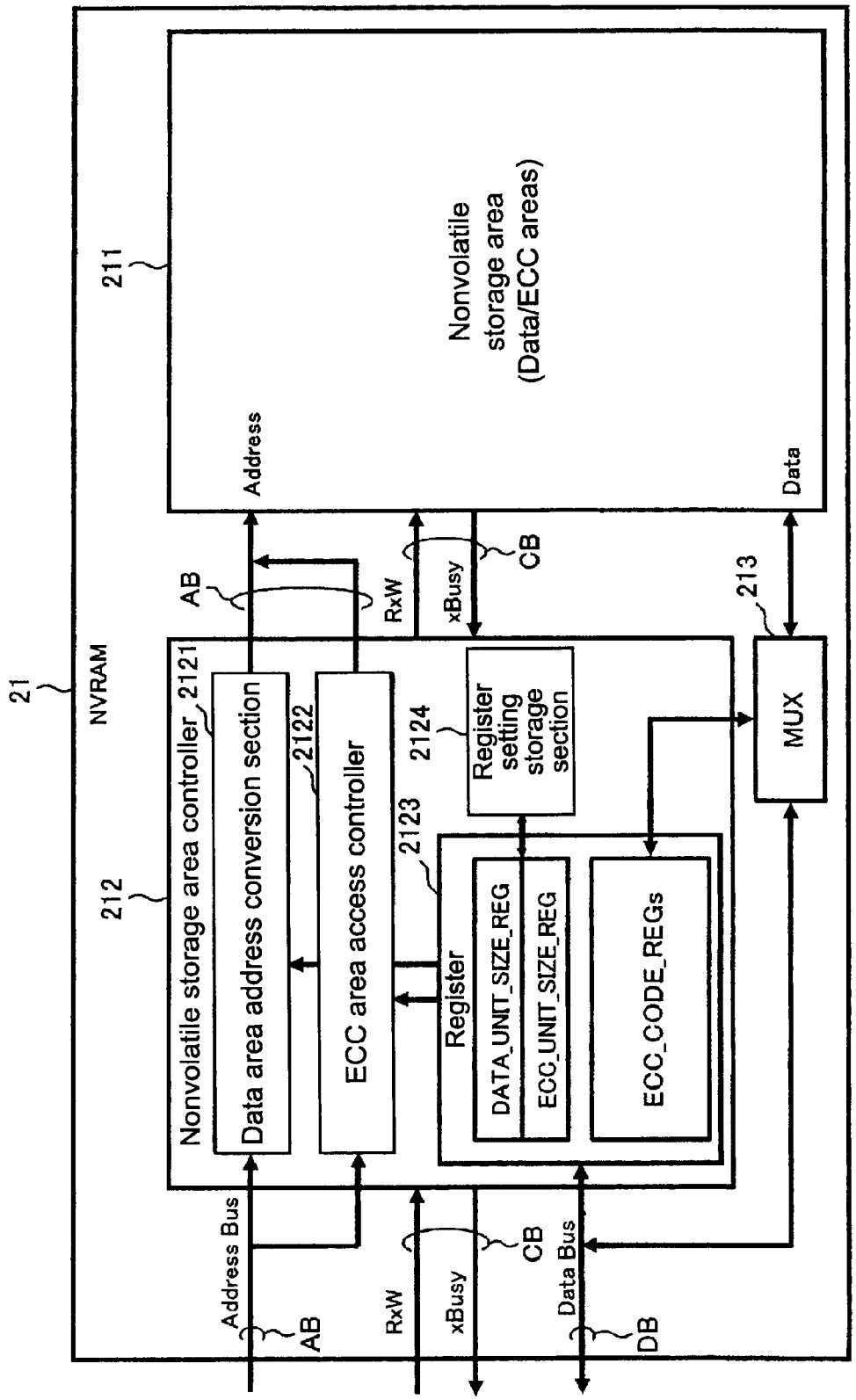
FIG. 6 is a diagram specifically showing a structural example of a nonvolatile storage area controller of the NVRAM according to the first embodiment.

FIG. 6 is a diagram specifically showing a structural example of the nonvolatile storage area controller 212 of the NVRAM 21 according to the first embodiment.

The NVRAM 21 of FIG. 6 shows an example in a case where the data area ARDT and the ECC area AREC are assigned on the single nonvolatile storage area 211.

The nonvolatile storage area controller 212 includes a data area address conversion section 2121, an ECC area access controller 2122, a register (register area ARRG) 2123, and a register setting storage section 2124 as an internal nonvolatile memory.

Further, in FIG. 6, AB represents an address bus, CB represents a control signal bus, and DB represents a data bus.

The data area address conversion section 2121 has a function of converting an address with respect to access to a data area (sectioned data area) from the memory controller 22.

The register 2123 is accessed as the register area ARRG from the memory controller 22.

The data area address conversion section 2121 has a function of switching a method of converting an address that is input in the NVRAM 21 into an internal address based on a value of each unit size that is set in the register 2123.

The ECC area access controller 2122 has a function of accessing, when the memory controller 22 accesses a data area (sectioned data area), an ECC area (sectioned ECC area) that is assigned to that data area.

The ECC area access controller 2122 generates an access address to access an ECC area (sectioned ECC area) by converting a data address that is input to specify the data area (sectioned data area) from the outside.

The memory controller 22 makes a setting for the nonvolatile storage area controller 212 by accessing each area of the register 2123 as the register area ARRG.

The ECC area access controller 2122 has a function of performing transfer between "ECC_CODE_REG" and an ECC area (sectioned ECC area) based on a value of an ECC area unit size of the ECC area (sectioned ECC area) that is set in the register 2123 within the nonvolatile storage area controller 212.

Accordingly, in a case where the data area (sectioned data area) is accessed, the value of the ECC area (sectioned ECC area) that is assigned to that data area is input/output between the register 2123 and the nonvolatile storage area 211 via a multiplexer 213.

The memory controller 22 accesses data of the ECC area (sectioned ECC area) via ECC_CODE_REG.

FIG. 7 is a diagram showing an example of the register area according to this embodiment.

In an example of FIG. 7, the register area ARRG in which each area has 4 bytes is formed.

An address REG[0] is a data area unit size register "DATA_UNIT_SIZE_REG" and is used for setting a size of an access unit of the data area (sectioned data area).

In a case of a data read (hereinafter, also referred to as read), a data area unit size is acquired from the data area unit size register "DATA_UNIT_SIZE_REG".

In a case of a data write (hereinafter, also referred to as write), a data area unit size is set in the data area unit size register "DATA_UNIT_SIZE_REG".

An address REG[4] is an ECC area unit size register "ECC_UNIT_SIZE_REG" and is used for setting a size of an ECC area (sectioned ECC area) that is assigned to the access unit of the data area (sectioned data area).

In a case of read, an ECC area unit size is acquired from the ECC area unit size register "ECC_UNIT_SIZE_REG".

In a case of write, an ECC area unit size is set in the ECC area unit size register "ECC_UNIT_SIZE_REG".

In a case where this register is not present, the nonvolatile storage area controller 212 uses the nonvolatile storage area setting function to determine an ECC area unit size so that the ECC area AREC can be divided based on the number of access units of the data area (sectioned data area) to which an ECC area (sectioned ECC area) is mapped.

Each of an address REG[8], an address REG[12] . . . is an ECC code register "ECC_CODE_X_REG" and is used for inputting/outputting an ECC area (sectioned ECC area) and an ECC code.

A last register number (X) to be used is determined based on a value set in the ECC area unit size register "ECC_UNIT_SIZE_REG".

By data read immediately after a data area (sectioned data area) is accessed for data read, a value of an ECC area (sectioned ECC area) that is associated with that data area is acquired from the ECC code register "ECC_CODE_X_REG".

When the data area (sectioned data area) is accessed for data write after data is written in the ECC code register "ECC_CODE_X_REG", a value of an ECC area (sectioned ECC area) that is associated with that data area is set.

Figure 8:
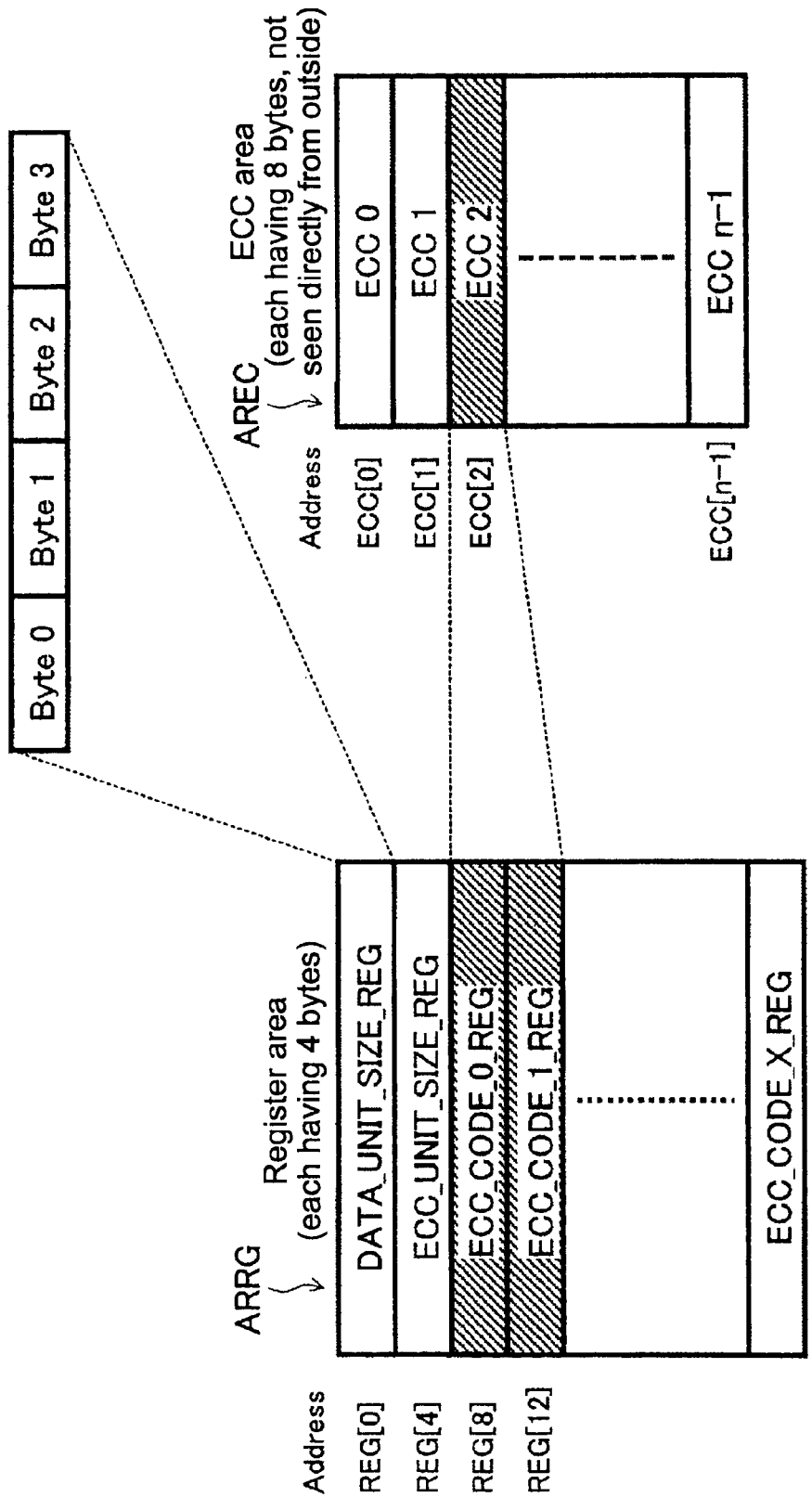
FIG. 8 is a diagram showing an example of a relationship with a register of a memory controller in a case where each ECC area of a nonvolatile storage area has 8 bytes.

FIG. 8 is a diagram showing an example of a relationship with a register of the memory controller in a case where an ECC area (sectioned ECC area) of the nonvolatile storage area 211 has 8 bytes. In "ECC_UNIT_SIZE_REG", a value of 0x08 indicating 8 bytes is set as an ECC area unit size.

In an example of FIG. 8, each area of a register of the memory controller 22 is constituted of 4 bytes.

Accordingly, two ECC code registers "ECC_CODE_(0, 1)_REG" of the address REG[8] and the address REG[12] corresponding to 8 bytes are assigned to an address ECC[2] of the ECC area AREC.

As described above, the example in which the ECC area AREC is accessed via the register area but not directly accessed unlike the data area ARDT has been described in this embodiment. However, the effect of the present invention is also obtained similarly when an address of an ECC area (sectioned ECC area) is directly specified and the ECC area can be accessed, as in the case of the data area.

The memory controller 22 controls the nonvolatile storage area controller 212 of the NVRAM 21 and has a function of setting a data area unit size used in the data area ARDT.

In addition to the above function, the memory controller 22 also has a function of setting an ECC area unit size in a case where the NVRAM 21 has a function of setting the ECC area unit size of the ECC area (sectioned ECC area), such as a function of the ECC area unit size register.

The memory controller 22 includes an NVRAM controller 221, a data buffer 222, a RAM interface 223 on the host side, and an NVRAM interface 224 on the NVRAM side.

The NVRAM controller 221 includes an ECC register 2212.

When data from the host apparatus 30 is written, the NVRAM controller 221 calculates an ECC code for each access of the data area unit size of the data area (sectioned data area) in the nonvolatile storage area 211 of the NVRAM 21, and registers the resultant in the ECC area (sectioned ECC area).

When data is read, the NVRAM controller 221 reads out data and the ECC code from the data area (sectioned data area) and the ECC area (sectioned ECC area) of the nonvolatile storage area 211, respectively, via the register shown in FIG. 7.

The NVRAM controller 221 uses the read ECC code to confirm and correct the data that has been read from the data area (sectioned data area).

Accordingly, the NVRAM controller 221 can enhance reliability of data.

Figure 9:
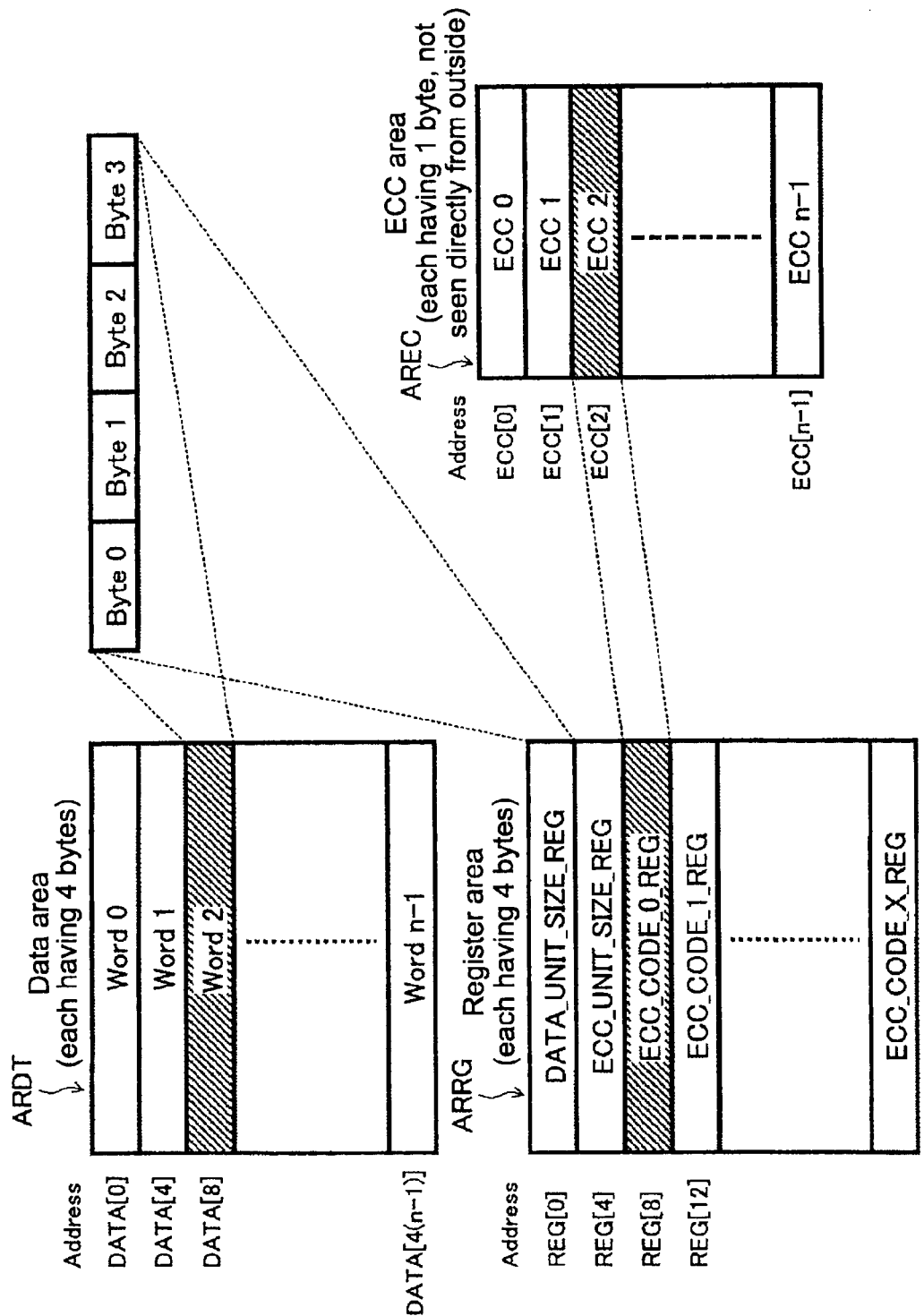
FIG. 9 is a diagram showing an example of a relationship among the data area, the register area, and the ECC area seen from the memory controller.

FIG. 9 is a diagram showing an example of a relationship among the data area ARDT, the register area ARRG, and the ECC area AREC seen from the memory controller.

In an example of FIG. 9, each data area or register area is constituted of 4 bytes, and each ECC area is constituted of 1 byte. An access unit of the data area (sectioned data area) that is set in the DATA_UNIT_SIZE_REG is 4 bytes and an access unit of the ECC area (sectioned ECC area) that is set in the ECC_UNIT_SIZE_REG is 1 byte. The ECC area is accessed via the register, which is not seen directly from the outside.

FIG. 9 shows an example of access in a case where an ECC area (sectioned ECC area) that is mapped to Word2 of the data area ARDT, which has an address of DATA[8], is ECC2 having an address of ECC[2].

In this case, when the Word2 of the data area ARDT, which has the address of DATA[8], is accessed for data read, a value of the ECC2 having the address of ECC[2] is read out via the ECC_CODE_0_REG.

When the Word2 of the data area ARDT, which has the address of DATA[8], is accessed for data write, a value set in ECC_CODE_0_REG is written in the ECC2 having the address of ECC[2].

In the example of FIG. 9, the ECC area AREC is accessed from the memory controller 22 via the register in a 4-byte unit. It should be noted that access in a unit of a bit may be possible in addition to access in a unit of a word or byte in accordance with the ECC area unit size of an ECC area (sectioned ECC area).

An ECC code to be used is determined in accordance with an application of the host apparatus 30 side. An ECC code having a higher correction ability is needed for data in which rewrite is carried out more frequently.

Specific examples are shown below.

FIRST SPECIFIC EXAMPLE

A first specific example is a case where as a code of the CPU, a data area (sectioned data area) has a unit of 1 Word that is equal to 4 bytes and is a read-only area, and an ECC is unnecessary.

In the register area ARRG as shown in FIG. 7, a value of 0x04 is set in "DATA_UNIT_SIZE_REG" and a value of 0x00 is set in "ECC_UNIT_SIZE_REG".

Regarding read-only data such as a program code, the number of rewrite is not increased. Accordingly, it is judged that an ECC code is unnecessary and the ECC area AREC is set to 0.

Consequently, the ECC area AREC is unused, with the result that the memory system can be used as a general ROM without an ECC.

(Second Specific Example)

A second specific example is a case where as a data area of the CPU, a data area (sectioned data area) has a 128-byte unit and is accessed for read/write and an ECC of 4 bytes is necessary.

In the register area ARRG as shown in FIG. 7, a value of 0x80 is set in "DATA_UNIT_SIZE_REG" and a value of 0x04 is set in "ECC_UNIT_SIZE_REG".

Figure 10:
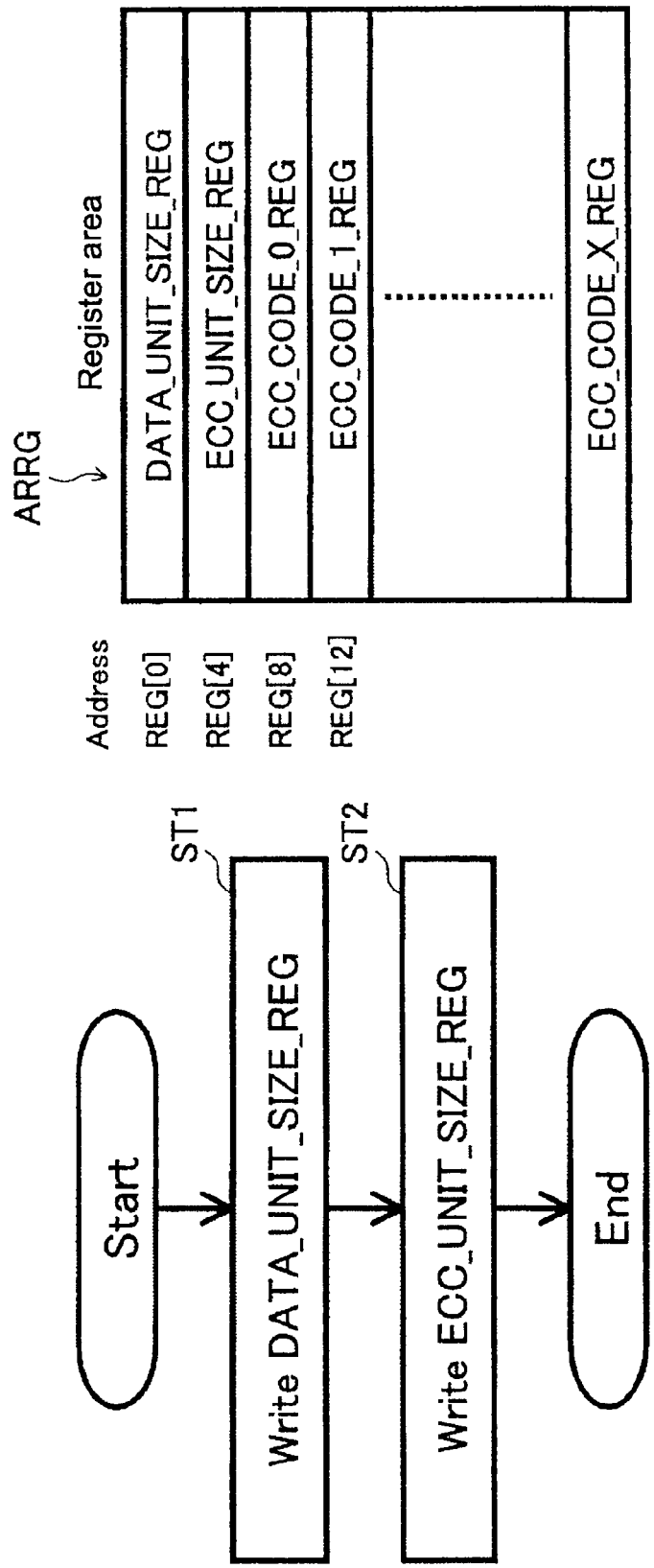
FIG. 10 are diagrams showing a processing procedure of a nonvolatile storage area setting function and the register area according to the first embodiment.

FIG. 10 are diagrams showing a processing procedure of the nonvolatile storage area setting function and the register area ARRG according to this embodiment.

In this embodiment, in the nonvolatile storage area controller 212, a data area unit size that is constituted of a plurality of bytes and is mainly used as a unit for access by the host apparatus 30 via the memory controller 22 is set.

By the nonvolatile storage area setting function, the data area unit size is written in the data area unit size register "DATA_UNIT_SIZE_REG" (ST1) and the ECC area unit size is written in the ECC area unit size register "ECC_UNIT_SIZE_REG" (ST2).

Next, processing of accessing the data area (sectioned data area) and the ECC area (sectioned ECC area) at a time of read and write will be described in association with FIGS. 11 and 12.

Figure 11:
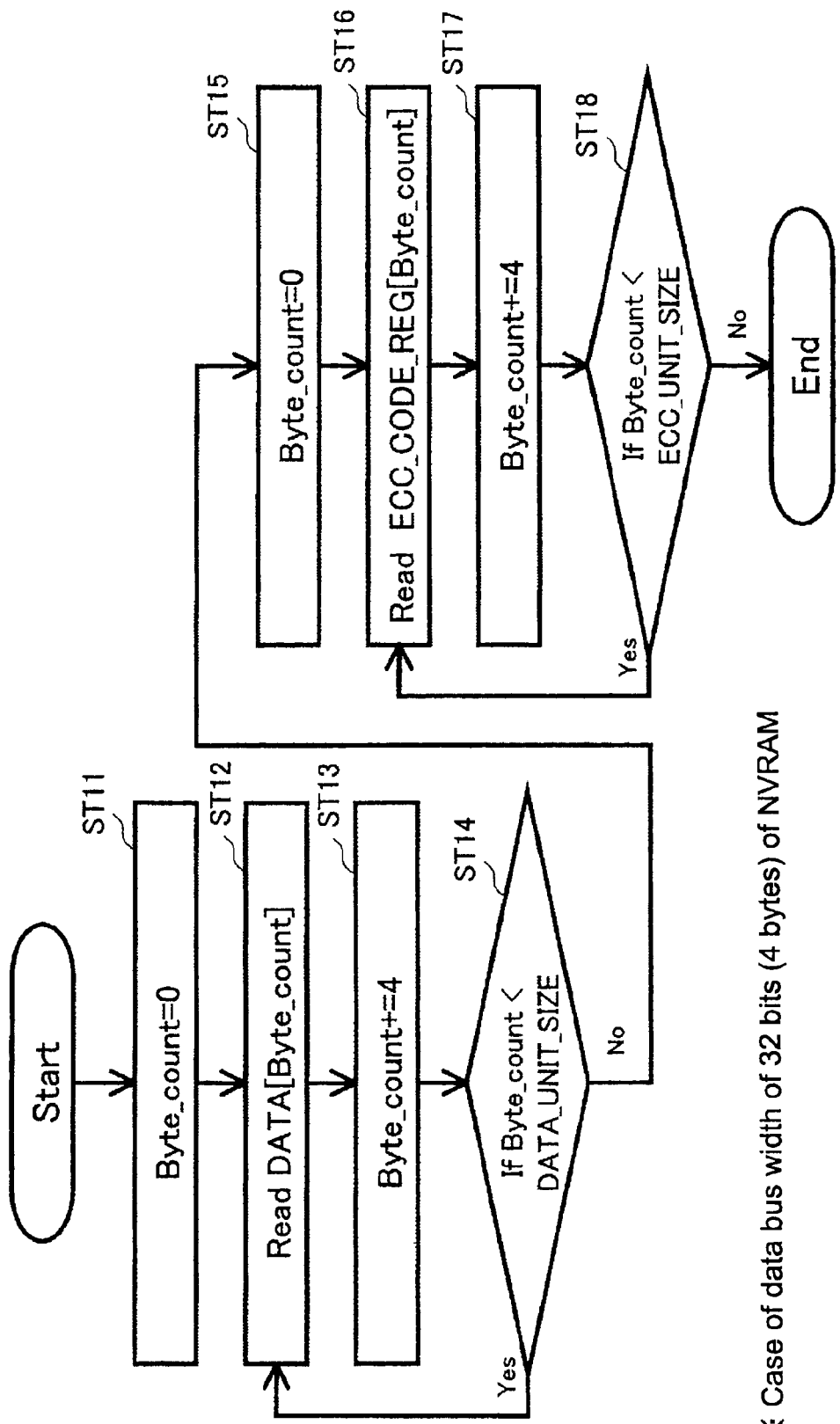
FIG. 11 is a flowchart for explaining processing of accessing the data area and the ECC area at a time of read.

FIG. 11 is a flowchart for explaining the processing of accessing the data area and the ECC area at a time of read.

Figure 12:
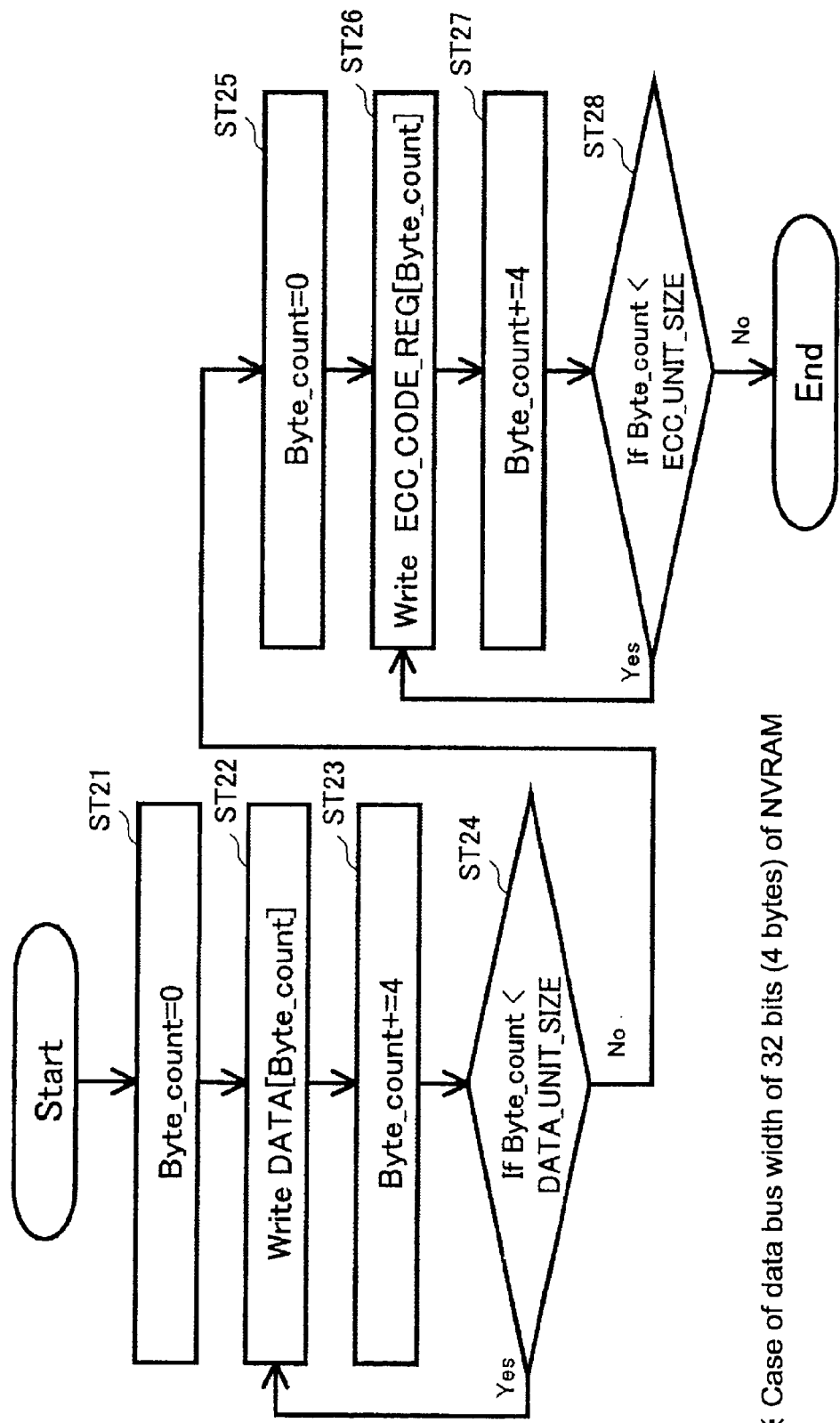
FIG. 12 is a flowchart for explaining the processing of accessing the data area and the ECC area at a time of write.

FIG. 12 is a flowchart for explaining the processing of accessing the data area and the ECC area at a time of write.

It should be noted that here, a case where a data bus width of the NVRAM 21 is 32 bits (4 bytes) and both the data area ARDT and the ECC area AREC are accessed in this bus width will be described. Accordingly, the host side also selects multiples of 4 bytes as a size of an access unit.

First, the processing of accessing the data area ARDT and the ECC area AREC at a time of read will be described in association with FIG. 11.

Data of the data area ARDT is read out for each 4 bytes from 0 byte (ST11 to ST13).

The data is continued to be read out until a byte count value becomes a data area unit size that is set in the data area unit size register "DATA_UNIT_SIZE_REG" of the register area ARRG (ST14).

When it is judged in Step ST14 that the byte count value exceeds the data area unit size that is set in the data area unit size register "DATA_UNIT_SIZE_REG", an ECC code of the ECC area (sectioned ECC area) is read out subsequent to the data read.

Data of the ECC area AREC is read out for each 4 bytes from 0 byte (ST15 to ST17).

The data is continued to be read out until a byte count value becomes an ECC area unit size that is set in the ECC area unit size register "ECC_UNIT_SIZE_REG" of the register area ARRG (ST18).

When it is judged in Step ST18 that the byte count value exceeds the ECC area unit size that is set in the ECC area unit size register "ECC_UNIT_SIZE_REG", the read of the data and the ECC code is terminated.

Next, the processing of accessing the data area ARDT and the ECC area AREC at a time of write will be described in association with FIG. 12.

Data is written in the data area ARDT for each 4 bytes from 0 byte (ST21 to ST23).

The data is continued to be written until a byte count value becomes a data area unit size that is set in the data area unit size register "DATA_UNIT_SIZE_REG" of the register area ARRG (ST24).

When it is judged in Step ST24 that the byte count value exceeds the data area unit size that is set in the data area unit size register "DATA_UNIT_SIZE_REG", an ECC code of the ECC area (sectioned ECC area) is written subsequent to the data write.

The ECC code is written in the ECC area AREC for each 4 bytes from 0 byte (ST25 to ST27).

The ECC code is continued to be written until a byte count value becomes an ECC area unit size that is set in the ECC area unit size register "ECC_UNIT_SIZE_REG" of the register area ARRG (ST28).

When it is judged in Step ST28 that the byte count value exceeds the ECC area unit size that is set in the ECC area unit size register "ECC_UNIT_SIZE_REG", the write of the data and the ECC code is terminated.

Next, processing of successively accessing a data area (sectioned data area) corresponding to the data area unit size and an ECC area (sectioned ECC area) corresponding to the ECC area unit size will be described in association with FIGS. 13A and 13B.

Figure 13B:
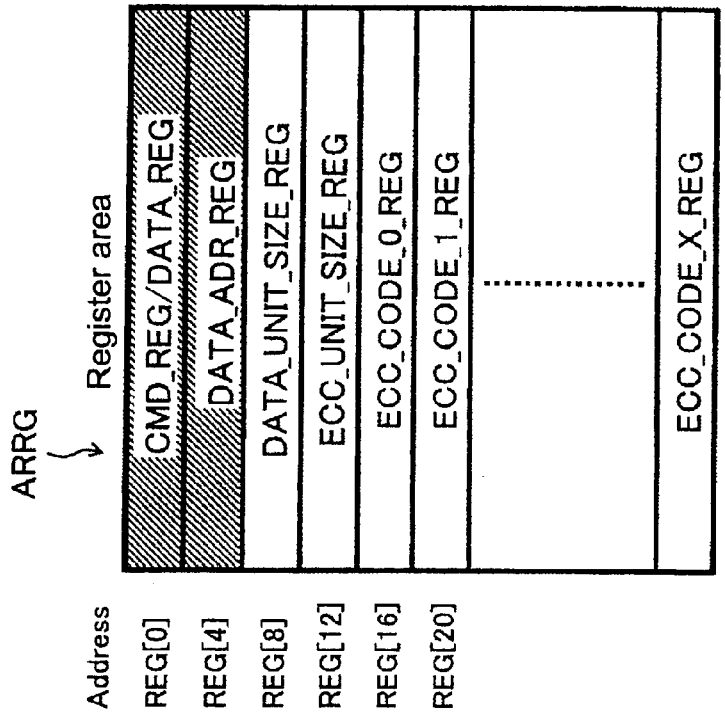
FIG. 13 are diagrams for explaining processing of successively accessing each data area with a data area unit size and each ECC area with an ECC area unit size by one command.
Figure 13A:
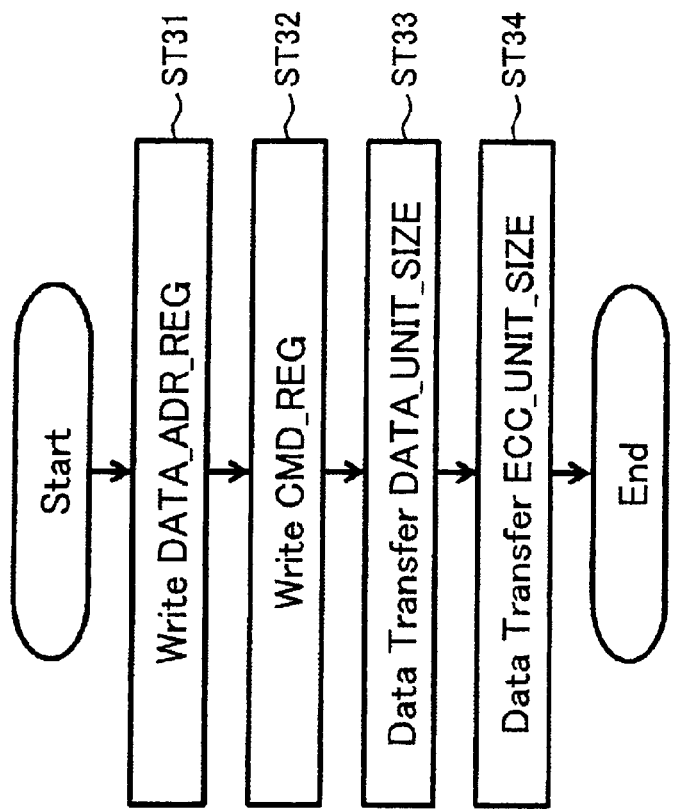

FIGS. 13A and 13B are diagrams for explaining the processing of successively accessing the data area (sectioned data area) corresponding to the data area unit size and the ECC area (sectioned ECC area) corresponding to the ECC area unit size.

FIG. 13A is a flowchart for explaining the processing of successively accessing the data area (sectioned data area) corresponding to the data area unit size and the ECC area (sectioned ECC area) corresponding to the ECC area unit size.

FIG. 13B shows an example of a register area that is used for the processing of successively accessing the data area (sectioned data area) corresponding to the data area unit size and the ECC area (sectioned ECC area) corresponding to the ECC area unit size.

In the successive access processing, in addition to the register of FIG. 7 or the like, registers for setting a command, a data transfer, and an argument thereof are added to the register area ARRG.

Specifically, three registers of a command setting register "CMD_REG", a data transfer register "DATA_REG", and a data address register "DATA_ADR_REG" are added.

Data write in the command setting register "CMD_REG" means that a command is set in the register and executed.

As an example, a "READ_UNIT command (0x01)" for successively reading out the data area (sectioned data area) corresponding to the data area unit size and the ECC area (sectioned ECC area) corresponding to the ECC area unit size and a "WRITE_UNIT command (0x02)" for successively writing the data area (sectioned data area) corresponding to the data area unit size and the ECC area (sectioned ECC area) corresponding to the ECC area unit size will be described.

Data write in the data address register "DATA_ADR_REG" means that an address of a data area (sectioned data area) that becomes an argument of a command is set.

After a command is set in "CMD_REG", "CMD_REG" is switched to "DATA_REG" for use in REG[0]. Specifically, based on the set command, a data transfer is successively performed by repeatedly reading out "DATA_REG" in a case of the READ_UNIT command or repeatedly writing in "DATA_REG" in a case of the WRITE_UNIT command.

Further, it is assumed that a unit size of each of a data area (sectioned data area) and an ECC area (sectioned ECC area) is set before the successive access processing is started.

In the successive access processing, an address of a data area ARDT (sectioned data area) that becomes an argument of a command is set in the data address register "DATA_ADR_REG" as shown in FIG. 13A (ST31).

Then, a command is set in the command setting register "CMD_REG" and executed (ST32).

In a case where a command to be set is the "READ_UNIT command (0x01)", the following processing is performed.

In a first step, an address of a data area (sectioned data area) to be read is set in "DATA_ADR_REG".

In a second step, a value of "0x01" indicating a READ_UNIT command is set in "CMD_REG", and then the successive access processing is started.

In a third step, from the address of the designated data area (sectioned data area), data corresponding to a data area unit size is output to "DATA_REG". In a fourth step, data corresponding to an ECC area unit size of an ECC area (sectioned ECC area) that is assigned to that data area (sectioned data area) is successively output to "DATA_REG" (ST33 and ST34).

In a case where a command to be set is the "WRITE_UNIT command (0x02)", the following processing is performed.

In a first step, an address of a data area (sectioned data area) to be written is set in "DATA_ADR_REG". In a second step, a value of "0x02" indicating a WRITE_UNIT command is set in "CMD_REG", and then the successive access processing is started.

In a third step, data corresponding to a data area unit size that is to be written in the address of the designated data area (sectioned data area) is input in "DATA_REG". In a fourth step, data corresponding to an ECC area unit size of an ECC area (sectioned ECC area) that is assigned to that data area is successively input in "DATA_REG". Thus, the data is written in each area (ST33 and ST34).

Next, a realization example in a case where an address range of the data area ARDT in which a setting of each unit size of the data area (sectioned data area) and the ECC area (sectioned ECC area) is valid can be designated will be described in association with FIG. 14.

Figure 14:
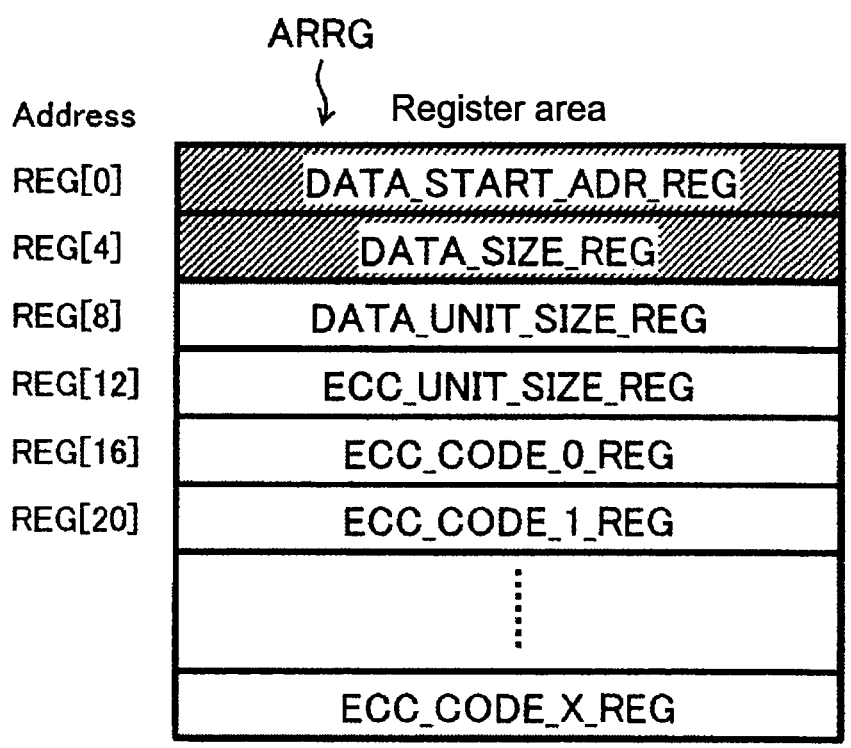
FIG. 14 is a diagram showing a realization example of the register area that includes, in a case where the data area unit size of each data area and the ECC area unit size of each ECC area are set, information designating an address range of the data area in which the setting is valid.

FIG. 14 is a diagram showing an example of the register area ARRG in a case where when a data area unit size of a data area (sectioned data area) is set, an extension for designating an address range of the data area ARDT in which that setting is valid is performed.

In this example, the NVRAM 21 can simultaneously have a plurality of data areas (sectioned data areas) and ECC areas (sectioned ECC areas) each having a different unit size.

In this case, in addition to the register of FIG. 7 or the like, two registers of a data area start address setting register "DATA_START_ADR_REG" and a data area size register "DATA_SIZE_REG" are added to the register area ARRG as shown in FIG. 14.

In the data area start address setting register "DATA_START_ADR_REG", a beginning address on a data area (sectioned data area) that is used for setting each unit size of a data area (sectioned data area) and an ECC area (sectioned ECC area) is set.

By setting an address value in "DATA_START_ADR_REG", the data area size register "DATA_SIZE_REG" performs the following processing at a time of read. Specifically, the data area size register "DATA_SIZE_REG" returns a size of an area whose beginning address is the address designated in "DATA_START_ADR_REG".

When data is written in "DATA_SIZE_REG" in this state, a size of an address area on the data area ARDT in which each unit size set in "DATA_UNIT_SIZE_REG" and "ECC_UNIT_SIZE_REG" is valid can be set.

By setting an address value in "DATA_START_ADR_REG", the data area unit size register "DATA_UNIT_SIZE_REG" performs the following processing at the time of read. Specifically, the data area unit size register "DATA_UNIT_SIZE_REG" returns a data area unit size of the address designated in "DATA_START_ADR_REG" at the time of read.

Accordingly, the memory controller 22 can confirm the data area unit size that is set for the data area (sectioned data area).

When data is written in "DATA_UNIT_SIZE_REG" in this state, the data area unit size can be changed.

By setting an address value in "DATA_START_ADR_REG", the ECC area unit size resister "ECC_UNIT_SIZE_REG" returns an ECC area unit size of the address designated in "DATA_START_ADR_REG" at the time of read.

Accordingly, the memory controller 22 can confirm the ECC area unit size that is set for the data area (sectioned data area).

When data is written in "ECC_UNIT_SIZE_REG" in this state, the ECC area unit size can be changed.

When a data area (sectioned data area) is accessed at the time of read, a value of an ECC area (sectioned ECC area) assigned to that data area is acquired from the ECC code resisters "ECC_CODE_0_REG" to "ECC_CODE_X_REG".

When a data area (sectioned data area) is accessed at the time of write, a value of an ECC area (sectioned ECC area) assigned to that data area is set.

A value of X is determined based on a maximum value that is valid as a setting of "ECC_UNIT_SIZE_REG", and a range of "ECC_CODE_0_REG" to "ECC_CODE_X_REG" used for access is determined based on a size of an ECC area (sectioned ECC area) that is assigned to an address thereof.

It should be noted that it is desired to store the state that is set in the register area ARRG in a nonvolatile memory that serves as a setting storage function section and is arranged inside the NVRAM 21.

In a case where the storage function is not provided, for example, the memory controller 22 that controls and manages the NVRAM 21 sets the state in the register each time, as part of initialization processing.

FIGS. 15A and 15B are flowcharts for explaining processing of setting information in accordance with presence/absence of the setting storage function within the NVRAM 21.

FIG. 15A shows a processing procedure in a case where the setting storage function is provided.

In this case, after the initialization of the NVRAM 21, for example, after a reset cancel, a setting is automatically loaded from a setting storage section (ST41).

FIG. 15B shows a processing procedure in a case where the setting storage function is not provided.

In this case, the memory controller 22 makes settings of the register before the NVRAM 21 is accessed (ST42). After the setting and initialization, the NVRAM 21 starts to be accessed (ST43).

(2. Second Embodiment)

Figure 16:
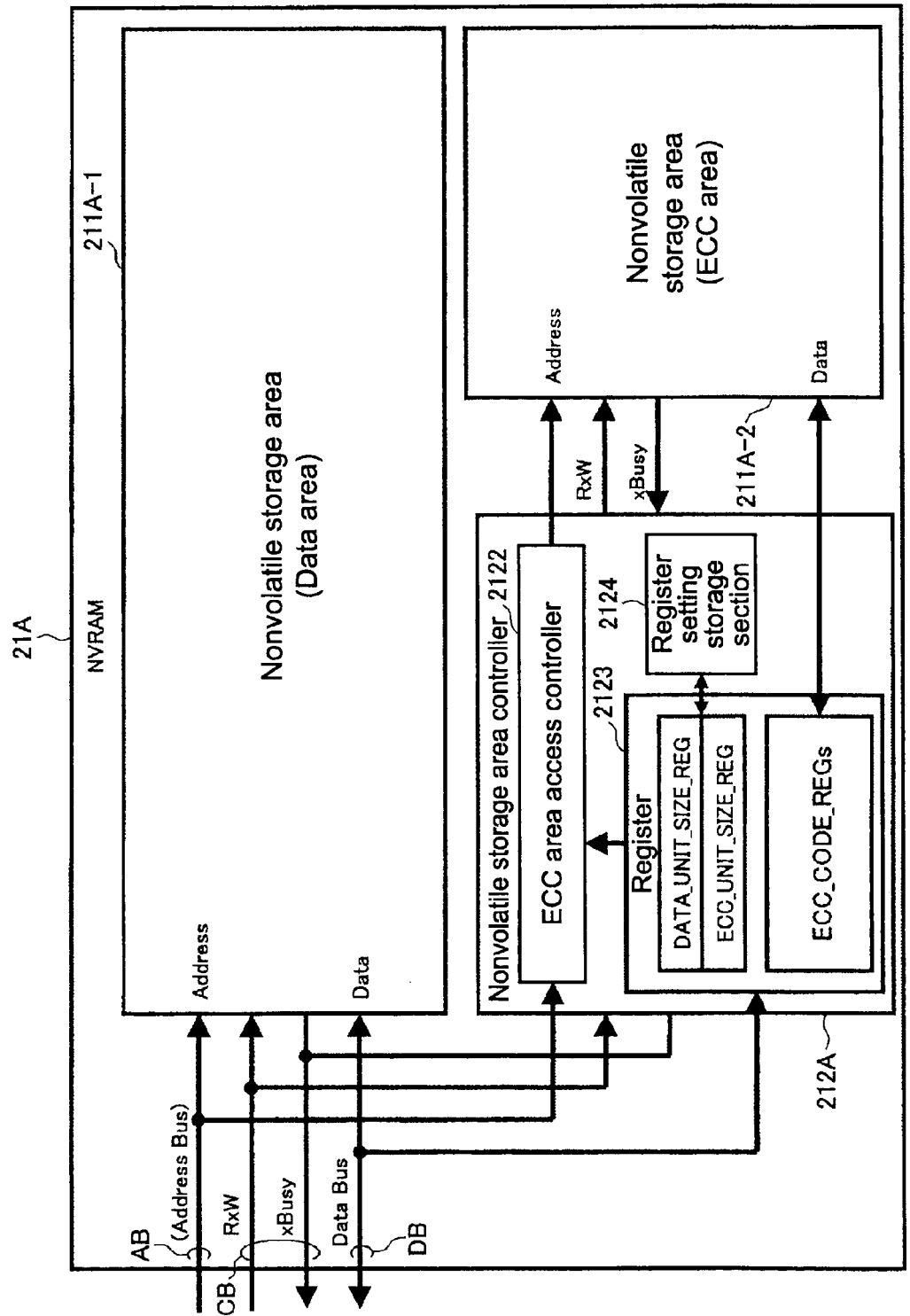
FIG. 16 is a diagram showing a structural example of an NVRAM according to a second embodiment of the present invention.

FIG. 16 is a diagram showing a structural example of an NVRAM according to a second embodiment of the present invention.

An NVRAM 21A according to the second embodiment is different from the NVRAM 21 of the first embodiment in that a nonvolatile storage area controller 212A is assigned to a nonvolatile storage area (ECC area) 211A-2 from which the data area is separated.

As in the case of the first embodiment, a data area 211A-1 is accessed with an address given from the memory controller 22 and the ECC area 211A-2 is accessed with an address generated by the nonvolatile storage area controller 212A.

In each NVRAM as a target of the embodiments of the present invention, the data area ARDT and the ECC area AREC are needed to be distinguishable from each other as address spaces, and it is not necessary that the NVRAM be actually divided as physical memory cells. FIGS. 6 and 16 are examples of the both cases.

The rewritable NVRAMs have been described in the above embodiments, but an NVRAM that needs deletion before rewrite is also applicable.

The ECC area is accessed via the register in the above embodiments, but a technique that realizes access by a control pin or a command is also applicable.

As described above, according to the embodiments, the following effects can be obtained.

In an NVRAM that is randomly accessible in a byte unit, a host apparatus side can make a setting according to a specification suitable for an application.

A structure inside the NVRAM can be changed on the assumption that the NVRAM is randomly accessed in a size set by the host apparatus.

An ECC code stored in an ECC area (sectioned ECC area) is calculated by the host side and recovery from a data error is enabled at a time of read, with the result that the number of rewrite in the NVRAM can be reduced.

Specifically, in a case of read-only data, ECC performance can be set to be minimum or unnecessary. In a case of data to be frequently rewritten, the ECC performance can be set to be maximum to enhance the reliability of the data.

The host apparatus can make the setting as described above with respect to the NVRAM via an NVM controller within a memory controller.

The memory controller can set a unit size of each of the data area (sectioned data area) and the ECC area (sectioned ECC area) for storing the ECC code with respect to the NVRAM.

The size of the ECC code is determined based on a data size as a target and a correction/detection ability of an ECC to be needed.

In other words, according to the embodiments, the host apparatus that uses the nonvolatile memory can determine a method of accessing the NVRAM based on an access unit size optimum for an application that operates on the host and ECC performance.

In a case where the host apparatus puts emphasis on random access performance in the above setting, it is possible to set a data unit of the data area in accordance with that access unit.

In a case where fast access is carried out by a DMA (Direct Memory Access) transfer or the like as a data transfer between the host apparatus and the memory controller, the access unit can be determined in accordance with a size appropriate for the DMA transfer.

An access unit that is expected to be used for random access to the NVRAM according to the embodiments of the present invention by the host apparatus and the application that operates thereon can be set as a data area unit size.

Further, overhead at a time of a data change caused by adding an ECC code can be decreased.

Figure 17:
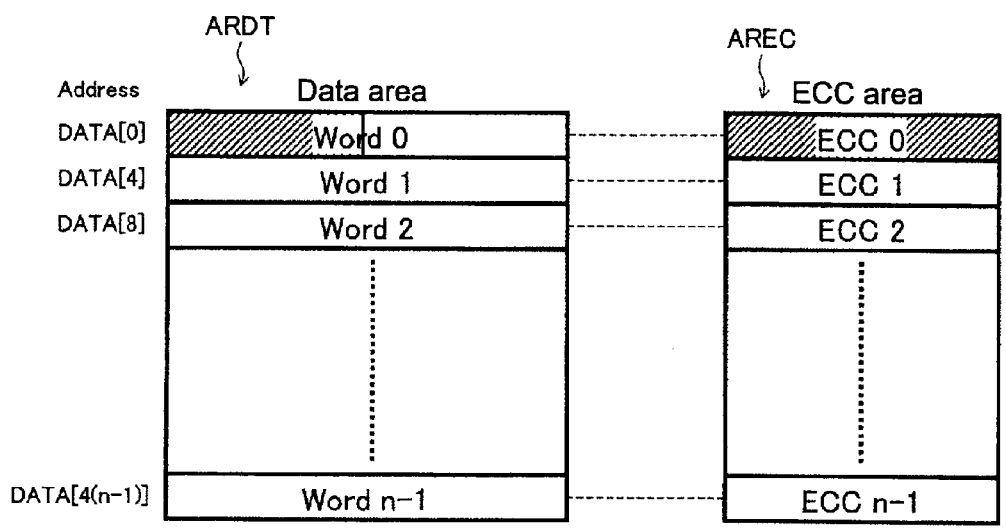
FIG. 17 is a diagram showing an example of overhead due to an access unit.

FIG. 17 is a diagram showing an example of the overhead due to an access unit.

A portion indicated by hatching is data that is actually accessed (half word, 16 bits).

Since the access size does not coincide with the data area unit size, it is necessary to read out data in word (32 bits) in order to calculate an ECC.

The example of 32 bits is given here, but a data amount to be read out in order to calculate an ECC is increased as the data area unit size is larger, and the performance is lowered as the overhead is increased.

According to this embodiment, by adjusting the data area unit size to the access size, it is unnecessary to read out excess data for the calculation of an ECC.

Moreover, by providing an area to which the ECC code is added in accordance with an address boundary that is expected for random access by a user, overhead by the ECC with respect to random access can be decreased.

Figure 18:
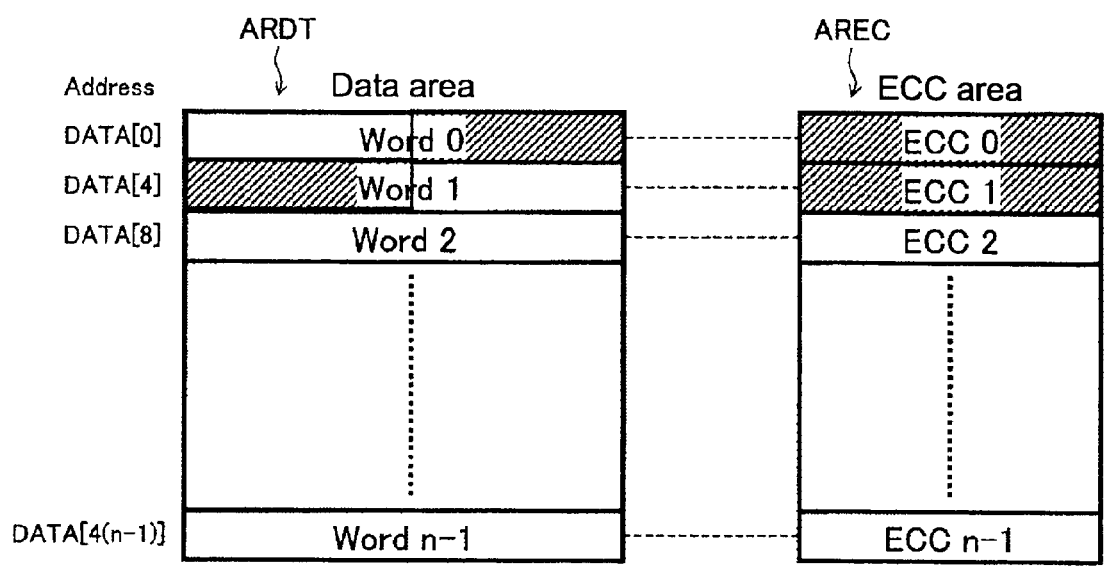
FIG. 18 is a diagram showing an example of the overhead due to an address boundary.

FIG. 18 is a diagram showing an example of the overhead due to an address boundary.

A portion indicated by hatching is data that is actually accessed (word, 32 bits).

Since the access size coincides with the data area unit size but boundaries of data do not coincide with each other, it is necessary to read out two words in order to calculate ECCs.

According to this embodiment, by matching the boundaries of the data area unit size to each other, it is possible to reduce the number of ECC calculations to once.

The present application contains subject matter related to that disclosed in Japanese Priority Patent Application JP 2009-183517 filed in the Japan Patent Office on Aug. 6, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile random access memory, comprising:
   a nonvolatile storage area that is randomly accessible and includes two areas:
      a data area to store data including at least one data area which is assigned a data area unit size, and
      an error-correcting-code area to store an error correcting code including at least one error-correcting-code area which is assigned an error-correcting-code-area unit size; and
   a nonvolatile storage area controller which:
      sets the data area unit size as a data size used when the at least one data area is accessed from an outside, and
      sets the error-correcting-code-area unit size,
   wherein the nonvolatile storage area controller
      manages the data area and the error-correcting-code area based on the set data area unit size, and
      assigns the at least one error-correcting-code area with the error-correcting-code-area unit size to the at least one data area with the data area unit size based on the data area unit size of the at least one data area.

2. The nonvolatile random access memory according to claim 1, wherein the nonvolatile storage area controller sets the error-correcting-code-area unit size of the at least one error-correcting-code area as in a case of a setting of the data area unit size of the at least one data area.

3. The nonvolatile random access memory according to claim 2, wherein the nonvolatile storage area controller:
   sets the error-correcting-code-area unit size based on the set data area unit size, and
   assigns the at least one error-correcting-code area to the at least one data area based on the data area unit size of the at least one data area.

4. The nonvolatile random access memory according to claim 1, configured to access the at least one data area with the set data area unit size.

5. The nonvolatile random access memory according to claim 1, configured to access the at least one error-correcting-code area with the set error-correcting-code-area unit size.

6. The nonvolatile random access memory according to claim 1, configured to successively access the at least one data area with the set data area unit size and the at least one error-correcting-code area with the set error-correcting-code-area unit size, the at least one error-correcting-code area being assigned to the at least one data area.

7. The nonvolatile random access memory according to claim 1, configured to designate an address range of the data area in which settings of the data area unit size and the error-correcting-code-area unit size are valid.

8. The nonvolatile random access memory according to claim 7, configured to have a plurality of combinations of the at least one data area and the at least one error-correcting-code area, in which the data area unit size and the error-correcting-code-area unit size are different from each other, by designating a plurality of address ranges of the data area in which the settings of the data area unit size and the error-correcting-code-area unit size are valid.

9. The nonvolatile random access memory according to claim 1, configured to store information set by the nonvolatile storage area controller in an internal nonvolatile storage.

10. The nonvolatile random access memory according to claim 9, configured to read the set information stored in the internal nonvolatile storage into the nonvolatile storage area controller as part of initialization processing before access is started from an outside.

11. The nonvolatile random access memory according to claim 10, wherein the set information is reset after the initialization processing in accordance with necessity of an application.

12. A nonvolatile memory system, comprising:
   a nonvolatile random access memory that is randomly accessible and includes
      a nonvolatile storage area that is randomly accessible and includes two areas:
         a data area including at least one data area which is assigned a data area unit size, and
         an error-correcting-code area to store an error correcting code including at least one error-correcting-code area which is assigned an error-correcting-code-area unit size, and
      a nonvolatile storage area controller which:
         sets the data area unit size as a data size used when the at least one data area is accessed an outside, and
         sets the error-correcting-code-area unit size; and
   a memory controller to control access to the nonvolatile random access memory,
   wherein the nonvolatile storage area controller
      manages the data area and the error-correcting-code area based on the set data area unit size, and
      assigns the at least one error-correcting-code area with the error-correcting-code-area unit size to the at least one data area with the data area unit size based on the data area unit size of the at least one data area.

13. The nonvolatile memory system according to claim 12, wherein the memory controller controls the nonvolatile storage area controller and sets the data area unit size and the error-correcting-code-area unit size.

14. The nonvolatile random access memory according to claim 1, wherein the data area and the error-correcting-code area are distinguishable from each other as address spaces.

15. The nonvolatile random access memory according to claim 1, wherein the data area is a physical memory cell divided from the error-correcting-code area.

16. The nonvolatile random access memory according to claim 1, wherein the error-correcting-code area is a physical memory cell divided from the data area.

17. The nonvolatile memory system according to claim 12, wherein the data area and the error-correcting-code area are distinguishable from each other as address spaces.

18. The nonvolatile memory system according to claim 12, wherein the data area is a physical memory cell divided from the error-correcting-code area.

19. The nonvolatile memory system according to claim 12, wherein the error-correcting-code area is a physical memory cell divided from the data area.

* * * * *